(12) United States Patent
Balakrishnan et al.

(10) Patent No.: US 10,396,075 B2
(45) Date of Patent: Aug. 27, 2019

(54) VERY NARROW ASPECT RATIO TRAPPING TRENCH STRUCTURE WITH SMOOTH TRENCH SIDEWALLS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/583,293

(22) Filed: May 1, 2017

(65) Prior Publication Data

US 2018/0315753 A1    Nov. 1, 2018

(51) Int. Cl.
| | | |
|---|---|---|
| *H01L 27/088* | (2006.01) | |
| *H01L 29/06* | (2006.01) | |
| *H01L 21/8234* | (2006.01) | |
| *H01L 21/02* | (2006.01) | |
| *H01L 21/308* | (2006.01) | |

(52) U.S. Cl.
CPC ...... *H01L 27/0886* (2013.01); *H01L 21/0254* (2013.01); *H01L 21/02381* (2013.01); *H01L 21/02609* (2013.01); *H01L 21/02639* (2013.01); *H01L 21/02647* (2013.01); *H01L 21/3086* (2013.01); *H01L 21/823431* (2013.01); *H01L 29/0649* (2013.01); *H01L 29/0657* (2013.01); *H01L 21/823481* (2013.01)

(58) Field of Classification Search
CPC ......... H01L 27/0886; H01L 21/823431; H01L 29/0649; H01L 29/0657
See application file for complete search history.

(56) References Cited

U.S. PATENT DOCUMENTS

| | | | | |
|---|---|---|---|---|
| 7,452,768 | B2 * | 11/2008 | Min ................ | H01L 21/823431 257/E21.661 |
| 8,703,556 | B2 * | 4/2014 | Kelly ................ | H01L 29/66795 257/296 |
| 9,337,050 | B1 * | 5/2016 | Xie ....................... | H01L 21/3086 |
| 9,496,400 | B1 * | 11/2016 | Balakrishnan ........ | H01L 29/785 |
| 9,941,150 | B1 * | 4/2018 | Bi ........................ | H05K 999/99 |
| 2010/0311213 | A1 * | 12/2010 | Orlowski .......... | H01L 29/66795 438/164 |
| 2011/0049568 | A1 * | 3/2011 | Lochtefeld ........ | H01L 21/02381 257/190 |
| 2012/0052640 | A1 * | 3/2012 | Fischer ........... | H01L 21/823425 438/268 |
| 2013/0161729 | A1 * | 6/2013 | Xie .................. | H01L 29/66795 257/329 |

(Continued)

*Primary Examiner* — Khiem D Nguyen
(74) *Attorney, Agent, or Firm* — Scully, Scott, Murphy & Presser, P.C.; L. Jeffrey Kelly, Esq.

(57) ABSTRACT

After forming a plurality of semiconductor fins that are separated from one another by trenches on a substrate, the semiconductor fins are fully or partially oxidized to provide semiconductor oxide portions. The volume expansion caused by the oxidation of the semiconductor fins reduces widths of the trenches, thereby providing narrowed trenches for formation of epitaxial semiconductor fins using aspect ratio trapping techniques.

10 Claims, 9 Drawing Sheets

(56) References Cited

U.S. PATENT DOCUMENTS

| | | | |
|---|---|---|---|
| 2014/0061862 A1* | 3/2014 | Vega | H01L 21/3081 257/616 |
| 2014/0346612 A1* | 11/2014 | Adam | H01L 21/76205 257/397 |
| 2015/0200276 A1* | 7/2015 | Cheng | H01L 29/66818 257/401 |
| 2015/0263128 A1* | 9/2015 | Basker | H01L 29/6681 257/288 |
| 2015/0380438 A1* | 12/2015 | Chudzik | H01L 27/1207 257/350 |
| 2017/0186873 A1* | 6/2017 | Kim | H01L 29/66545 |

* cited by examiner

US 10,396,075 B2

VERY NARROW ASPECT RATIO TRAPPING TRENCH STRUCTURE WITH SMOOTH TRENCH SIDEWALLS

BACKGROUND

The present application relates to aspect ratio trapping (ART), and more particularly to the formation of narrow ART trench structures for heteroepitaxy.

Heteroepitaxy is the process of epitaxially growing one semiconductor material on another. Since the crystal structures of two semiconductor materials are usually different, issues can arise involving lattice mismatch between the different crystal structures. These differences are responsible for the formation of dislocation defects. ART has been developed to enable heteroepitaxial growth with reduced defect density. For fin field effect transistors (FinFETs), fins formed by heteroepitaxy typically require formation of ART trenches at fin dimensions (typically with a width around 12 nm or less). However, forming ART trenches at such small fin dimensions is very challenging.

SUMMARY

The present application provides methods for formation of narrow ART trenches for heteroepitaxy. The narrow ART trenches are formed by oxidation of semiconductor fins to provide semiconductor oxide portions. The semiconductor oxide portions partially filling trenches between originally formed semiconductor fins, thus reducing the widths of these trenches.

In one aspect of the present application, a semiconductor structure is provided. In one embodiment, the semiconductor structure includes a plurality of epitaxial semiconductor fins located on a substrate, a bottom spacer laterally surrounding a bottom portion of each epitaxial semiconductor fin, and a semiconductor oxide insulator structure located between each pair of neighboring epitaxial semiconductor fins and neighboring bottom spacers. The semiconductor oxide insulator structure has a topmost surface located below a topmost surface of each epitaxial semiconductor fin.

In another aspect of the present application, a method of forming a semiconductor structure is provided. The method includes first forming a plurality of semiconductor fins located on a substrate. The plurality of semiconductor fins are separated from one another by first trenches having a first width. At least a portion of each of the plurality of semiconductor fins is then oxidized to provide a semiconductor oxide portion. The semiconductor oxide portions are separated from one another by second trenches having a second width less than the first width. Next, an epitaxial semiconductor layer is formed within each second trench.

DETAILED DESCRIPTION

Figure 1:
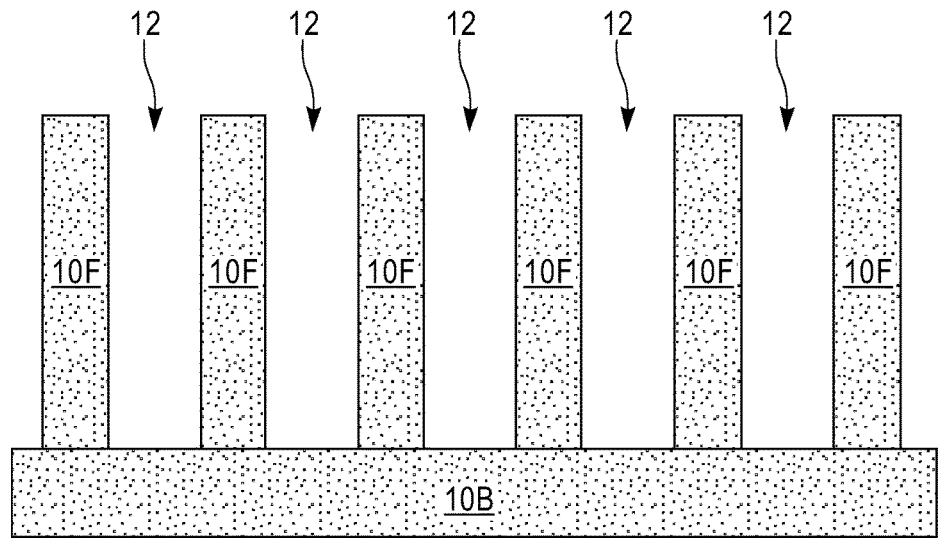
FIG. 1 is a cross sectional view of a first exemplary semiconductor structure containing a plurality of semiconductor fins extending upwards from a semiconductor substrate portion according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is shown a first exemplary semiconductor structure containing a plurality of semiconductor fins 10F extending upwards from a remaining portion of a semiconductor substrate (i.e., semiconductor substrate portion 10B) that can be employed according to a first embodiment of the present application. As is shown, a trench 12 is located adjacent each semiconductor fin 10F.

The first exemplary semiconductor structure shown in FIG. 1 can be formed by first providing a semiconductor substrate (not shown). The semiconductor substrate that can be used in the present application is a bulk semiconductor substrate. By "bulk" semiconductor substrate, it is meant a substrate that is entirely composed of at least one semiconductor material that has semiconducting properties. Examples of materials that have semiconducting properties and thus can be employed as the semiconductor material that provides the semiconductor substrate include silicon (Si), germanium (Ge), silicon germanium alloys (SiGe), silicon carbide (SiC) or silicon germanium carbide (SiGeC). In one embodiment, the semiconductor substrate is composed entirely of silicon.

The at least one semiconductor material that provides the semiconductor substrate may be single crystalline, polycrystalline or amorphous. In one example, the entirety of, or at least a topmost portion of, the semiconductor substrate is composed of a single crystalline semiconductor material such as, for example, single crystalline silicon.

After providing the semiconductor substrate, the semiconductor substrate is then patterned to provide the first exemplary semiconductor structure shown in FIG. 1. In the present application, each semiconductor fin 10F is formed within an upper semiconductor material portion of the semiconductor substrate, while the semiconductor substrate portion 10B represents a remaining lower semiconductor material portion of the semiconductor substrate.

In one embodiment of the present application, conventional lithography and etching may be employed to provide the plurality of semiconductor fins 10F. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops within a portion of the semiconductor substrate.

Following patterning of the semiconductor substrate to provide semiconductor fins 10F, an anneal is performed to smooth the sidewalls of the semiconductor fins 10F. In one embodiment, the semiconductor fins 10F are annealed under a hydrogen environment to provide semiconductor fins 10F having smooth sidewalls.

As used herein, a "semiconductor fin" refers to a remaining portion of the semiconductor substrate and including a pair of vertical sidewalls that are parallel to each other. As used herein, a surface is "vertical" if there exists a vertical plane from which the surface does not deviate by more than three times the root mean square roughness of the surface. The semiconductor fin 10F formed in the present application are "wide" fins having a width about 16 nm and above. The formation of "wider" fins allows better process control, less fin erosion and less taper in the fin. The height of each semiconductor fin 10F can be from 50 nm to 150 nm; although other heights that are lesser than, or greater than, the aforementioned range may also be employed. Each semiconductor fin 10F is spaced apart from its nearest neighboring semiconductor fin 10F by the width of one of the trenches 12. In one embodiment, the width of each trench 12 is from 25 nm to 100 nm. Also, the semiconductor fins 10F are oriented parallel to each other.

Figure 2:
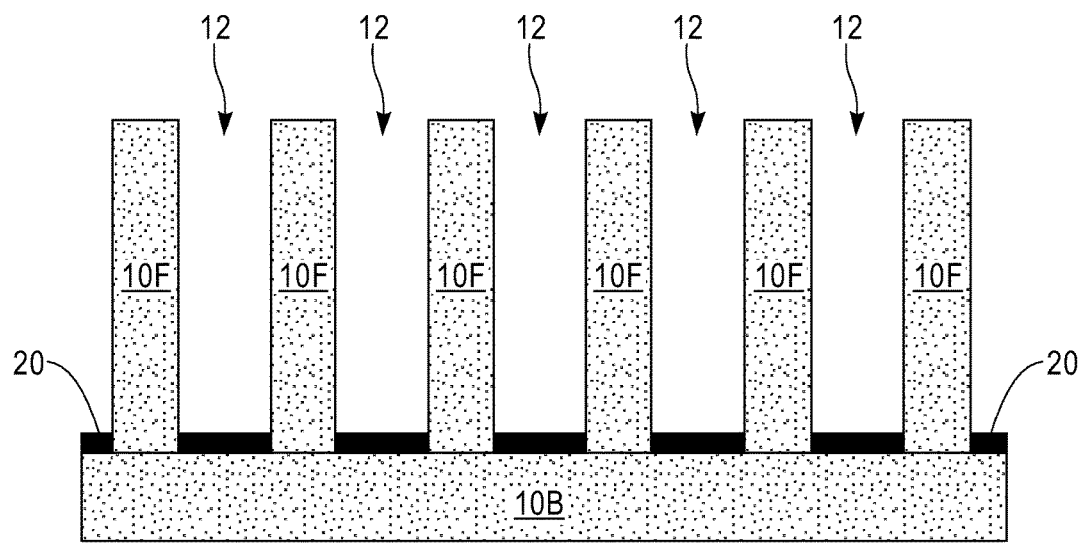
FIG. 2 is a cross sectional view of the first exemplary semiconductor structure of FIG. 1 after forming a bottom spacer layer around a bottom portion of each semiconductor fin.

Referring now to FIG. 2, there are illustrated the first exemplary semiconductor structure of FIG. 1 after forming a bottom spacer layer 20 around a bottom portion of each semiconductor fin 10F. A topmost surface of the bottom spacer layer 20 thus is vertically offset from and located beneath a topmost surface of each semiconductor fin 10F. The bottom spacer layer 20 may have a thickness ranging from 50 nm to 80 nm, although lesser and greater thicknesses can also be employed.

The bottom spacer layer 20 may include a dielectric oxide and/or a dielectric nitride. In one embodiment, the bottom spacer layer 20 is composed of silicon nitride. The bottom spacer layer 20 may be formed by depositing a dielectric material over the semiconductor substrate portion 10B and the semiconductor fins 10F using a conventional deposition technique, such as, for example, chemical vapor deposition (CVD) or physical vapor deposition (PVD), planarizing the deposited dielectric material by a conventional planarization technique such as, for example, chemical mechanical planarization (CMP), and then etching back the deposited dielectric material to the desired thickness. In some embodiments, the planarization step may be omitted. An anisotropic etch such as, for example, reactive ion etching (RIE) may be employed to remove the dielectric material that provides the bottom spacer layer 20 selective to the semiconductor material that provides the semiconductor fins 10F.

Figure 3:
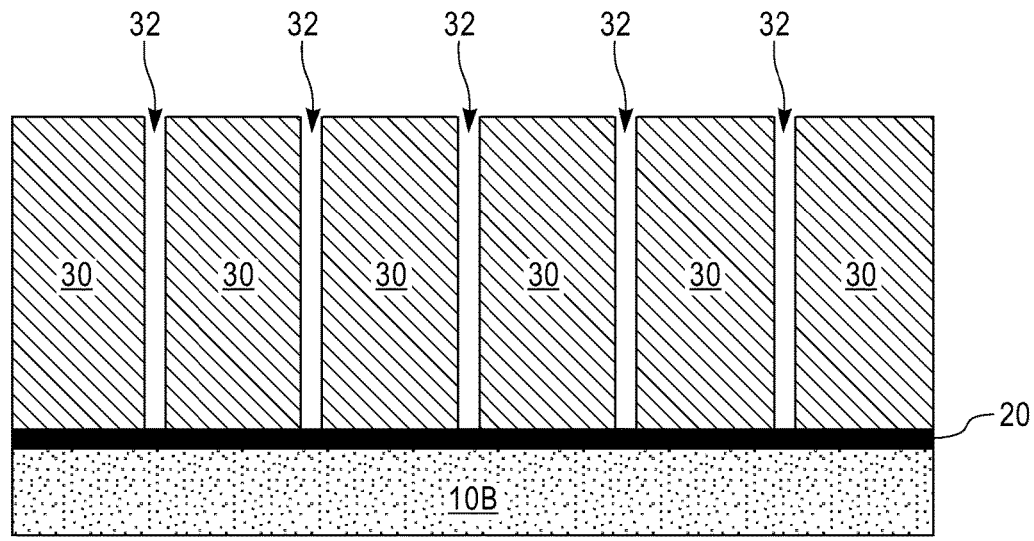
FIG. 3 is a cross sectional view of the first exemplary semiconductor structure of FIG. 2 after fully oxidizing the semiconductor fins to provide semiconductor oxide portions, thereby forming narrowed trenches between semiconductor oxide portions.

Referring now to FIG. 3, there is illustrated the first exemplary semiconductor structure of FIG. 2 after fully oxidizing each semiconductor fin 10F to provide a semiconductor oxide portion 30. Since the specific volume of semiconductor oxide is greater than of that of the corresponding semiconductor, the oxidation of the semiconductor fins 10F causes the resulting semiconductor oxide portions 30 to expand and partially fill the trenches 12. After oxidation, a narrowed trench 32 is provided between each neighboring pair of semiconductor oxide portions 30. The oxidation process can be controlled so that the width of each narrowed trench 32 is exactly the needed fin width. A width of each narrowed trench 32 can be from 5 nm to 12 nm, although lesser and greater thicknesses can also be employed.

In the present application, sidewalls of the narrowed trenches 32 are defined by the semiconductor oxide portions 30 which are formed by the thermal oxidation of semiconductor fins 10F. The use of thermal oxidation rather than lithography etching to define narrowed trenches 32 allows formation of ART trenches with smooth sidewalls. The smooth sidewalls can suppress sidewall induced defects during the subsequent heteroepitaxial growth process.

In one embodiment, the semiconductor fins 10F can be oxidized by a thermal oxidation process. In one embodiment, the oxidation process can be performed at a temperature from 600° C. to 1200° C. Moreover, the oxidation process can be performed in an oxidizing ambient which includes at least one oxygen-containing gas such as, for example, $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr or Ne.

The oxidation process of the present application may be carried out for a variable period of time. In one example, the oxidation process can be carried out for a time period from 5 seconds to about 5 hours, depending on thermal oxidation temperature, oxidation species and the width of each semiconductor fin 10F. The oxidation process of the present application may be carried out at a single targeted temperature, or various ramp and soak cycles using various ramp rates and soak times can be employed.

Figure 4:
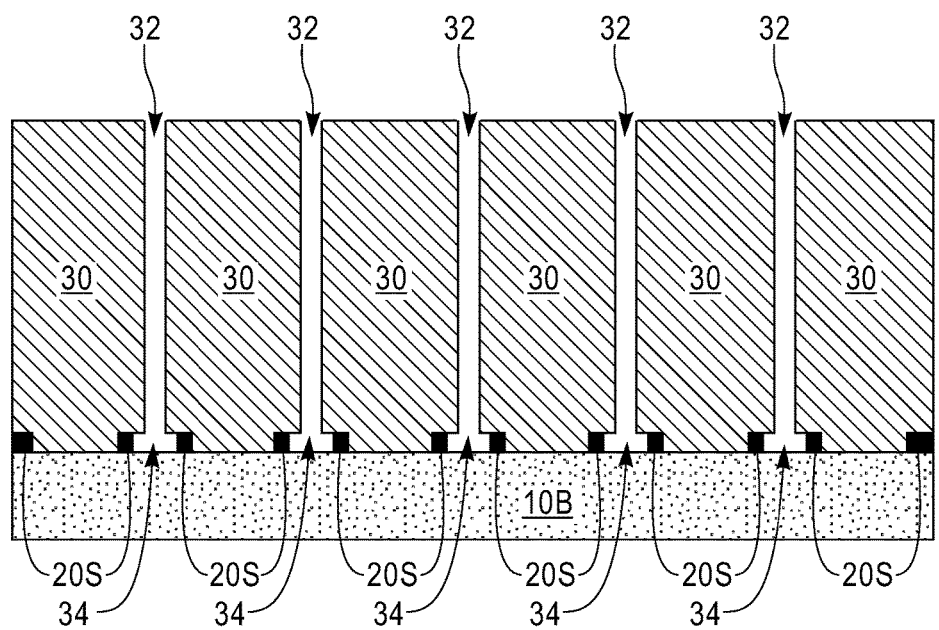
FIG. 4 is a cross sectional view of the first exemplary semiconductor structure of FIG. 3 after etching the bottom spacer layer to form an opening underneath each narrowed trench.

Referring now to FIG. 4, there is illustrated the first exemplary semiconductor structure of FIG. 3 after etching a portion of the bottom spacer layer 20 to form an opening 34 underneath each narrowed trench 32. The opening 34 is wider than the overlying narrowed trench 32 and exposes a portion of the topmost surface of the semiconductor substrate portion 10B The bottom spacer layer 20 can be etched by a directional etching process. In one embodiment, the bottom spacer layer 20 is etched by an anisotropic etch followed by an isotropic etch. The anisotropic etch removes portions of the bottom spacer layer 20 that are exposed by the narrowed trenches 32. Following the anisotropic etch, an isotropic etch is performed. The lateral etching of physically exposed sidewalls of the bottom spacer layer 20 occurs during the isotropic etch, thereby undercutting portions of the bottom spacer layer 20 underneath the semiconductor oxide portions 30. Sidewalls of each opening 34 are thus offset from sidewalls of a corresponding overlying narrowed trench 32. A remaining portion of the bottom spacer layer 20 laterally surrounding each opening 34 constitutes a bottom spacer 20S. Collectively, a narrowed trench 32 and an opening 34 underneath the narrowed trench 32 constitute an ART trench. Each ART trench (32, 34) thus has a widened bottom portion (i.e., the opening 34) exposes a portion of the topmost surface of the semiconductor substrate portion 10B.

Figure 5:
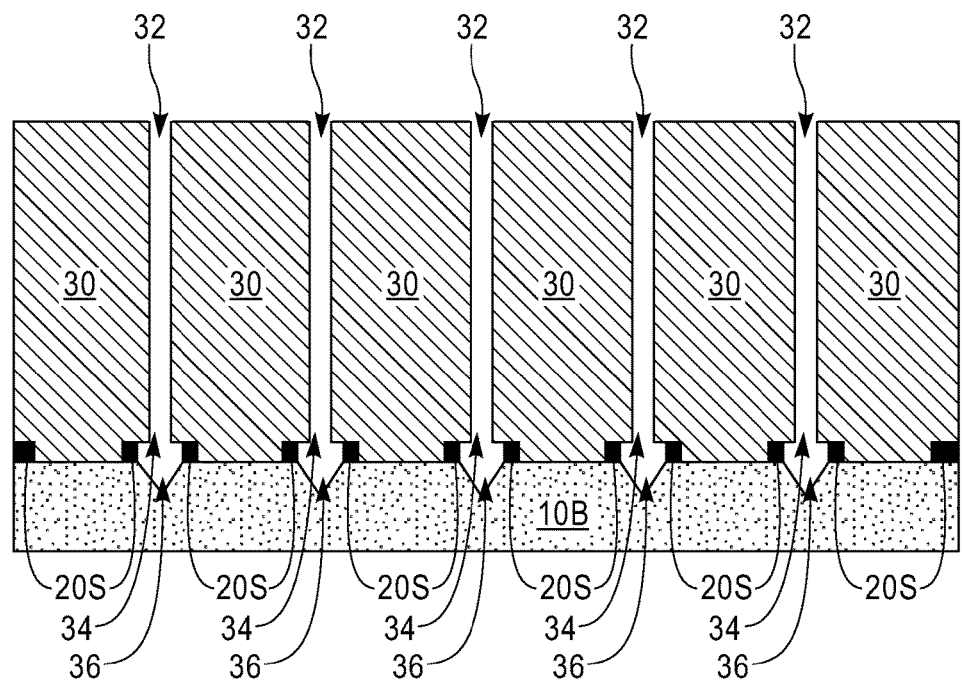
FIG. 5 is a cross sectional view of the first exemplary semiconductor structure of FIG. 4 after forming a faceted opening within the semiconductor substrate portion underneath each opening.

Referring now to FIG. 5, there is illustrated the first exemplary semiconductor structure of FIG. 4 after forming a faceted opening 36 within the semiconductor substrate portion 10B underneath each opening 34. Each faceted opening 36 can be formed by performing an anisotropic etch that removes portions of the semiconductor substrate portion 10B that are physically exposed at the bottom of the openings 34. In one embodiment, the physically exposed portions of the semiconductor portion 10B can be removed by a wet etch using, for example, a potassium hydroxide (KOH) solution. The wet etch results in the (111) surface of the semiconductor substrate portion 10B to be physically exposed, and providing faceted openings 36 with slopes having (111) surface orientation. In one embodiment and as is shown, each faceted opening 36 is V-shaped. The formation of the faceted openings 36 is optional and can be omitted in some embodiments of the present application. If present, each ART trench (32, 24) also includes a faceted opening 36.

Figure 6:
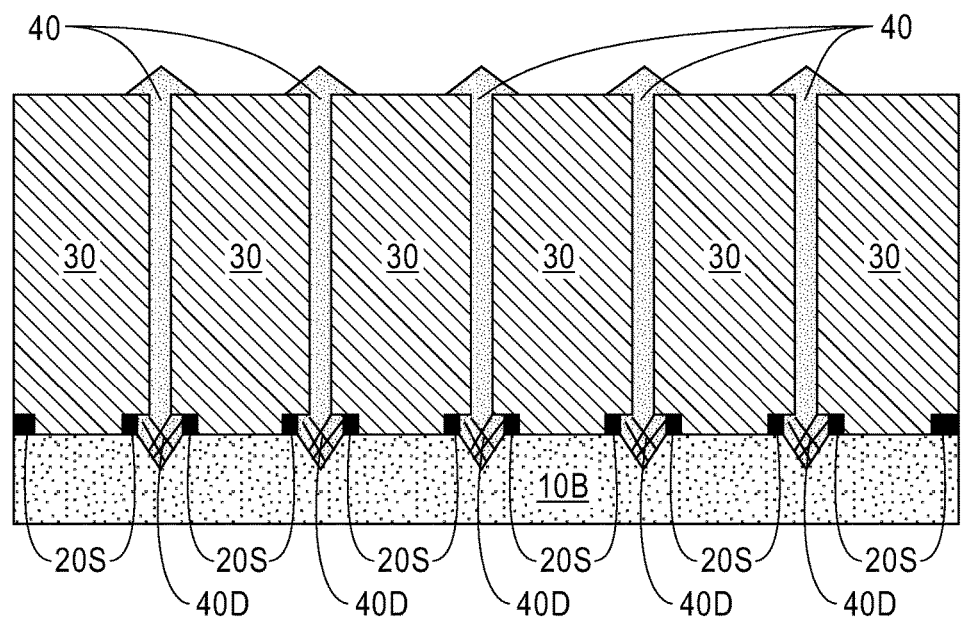
FIG. 6 is a cross sectional view of the first exemplary semiconductor structure of FIG. 5 after forming an epitaxial semiconductor layer from a surface of the semiconductor substrate portion exposed by each opening or by each faceted opening, if present.

Referring now to FIG. 6, there is illustrated the first exemplary semiconductor structure of FIG. 5 after forming an epitaxial semiconductor layer 40 from a surface of each physically exposed portion of the semiconductor substrate portion 10B and within each ART trench (32, 34, 36) utilizing an aspect ratio trapping growth process. In embodiments in which no faceted openings 36 are formed, each epitaxial semiconductor layer 40 is grown from a planar surface of the semiconductor substrate portion 10B (not shown). Each epitaxial semiconductor layer 40 has a width that is narrower than the previously formed semiconductor fins 10F.

Each epitaxial semiconductor layer 40 includes a different semiconductor material than the semiconductor substrate portion 10B. In one embodiment and when the semiconductor substrate portion 10B is composed of silicon, each epitaxial semiconductor layer 40 may be composed of a III-V compound semiconductor material such as, for example, GaN or AlGaN.

The aspect ratio trapping process that is used in providing each epitaxial semiconductor layer 40 is an epitaxial regrowth process such as described in U.S. Patent Application Publication No. 2011/0049568 to Lochtefeld et al., the entire content of which is incorporated herein by reference. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Exemplary epitaxial growth process that can be employed in the present application include, but are not limited to rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C.

During the epitaxial growth, the semiconductor material that provides the epitaxial semiconductor layers 40 is deposited only over the semiconductor surface, i.e., the surface of the semiconductor substrate portion 10B that is exposed by each ART trench (32, 34), or by each faceted opening 36, if present, and does not grow on dielectric surfaces, such as surfaces of the semiconductor oxide portions 30. Notably, since an epitaxial regrowth process is used in forming the epitaxial semiconductor layers 40, each epitaxial semiconductor layer 40 has a same crystalline characteristic as the underlying semiconductor substrate portion 10B. In one embodiment of the present application, each epitaxial semiconductor layer 40 has a surface having a (111) surface orientation.

In one embodiment and as is shown, each epitaxial semiconductor layer 40 has a topmost surface that extends above a topmost surface of each semiconductor oxide portion 30 and is chevron shaped. By "chevron shaped" it is meant that each epitaxial semiconductor layer 40 has a topmost surface that is bound by 111-planes (and is thus has an inverted V-shaped pattern).

Because of the aspect ratio of the ART trenches (32, 34, 36), the defects within each epitaxial semiconductor layer 40 are trapped along the sidewalls of the bottom portion of each ART trench (32, 34, 36). Accordingly, the upper portion of each epitaxial semiconductor layer 40 is substantially exhausted of defects; i.e., "substantially defect-free". A density of such defects in the upper portion of each epitaxial semiconductor layer 40 is less than, for example, $10^6$ defects/cm$^2$, preferably less than $10^3$ defects/cm$^2$.

Figure 7:
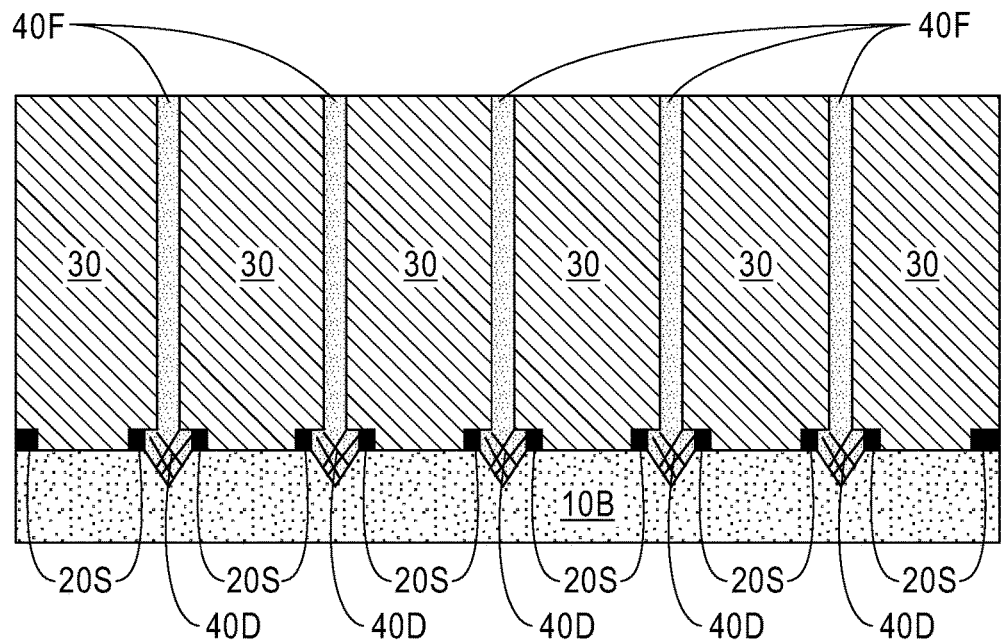
FIG. 7 is a cross sectional view of the first exemplary semiconductor structure of FIG. 6 after planarizing the epitaxial semiconductor layers to form epitaxial semiconductor fins.

Referring now to FIG. 7, there is illustrated the first exemplary semiconductor structure of FIG. 6 are performing a planarization process. The planarization process removes top portions of each epitaxial semiconductor layer 40 and each semiconductor oxide portion 30 such that a planarized topmost surface of each epitaxial semiconductor layer 40 is coplanar with a planarized topmost surface of each semiconductor oxide portion 30. The planarization process that can be used to provide the exemplary semiconductor structure shown in FIG. 7 may include CMP and/or grinding. The planarization process also removes damaged and/or widened top portion of each semiconductor oxide portion 30 created by the etching process that is employed to the formation of the openings 34. A remaining portion of each epitaxial semiconductor layer 40 constitutes an epitaxial semiconductor fin 40F. Each epitaxial semiconductor fin 40F has a width that is narrower than a width of the previously formed semiconductor fins 10F.

In the present application, because sidewalls of the bottom spacers 20S are offset from sidewalls of the semiconductor oxide portions 30, each epitaxial semiconductor fin 40F formed has an inverted T-shape, which includes a horizon portion and a vertical portion extending upwards from the horizontal portion. The horizontal portion of each epitaxial semiconductor fin 40F extends beyond the edges of the vertical portion. In some embodiment, each epitaxial semiconductor fin 40F also includes a faceted portion embedded in the semiconductor substrate portion 10B when the faceted opening 36 is formed therein.

Figure 8:
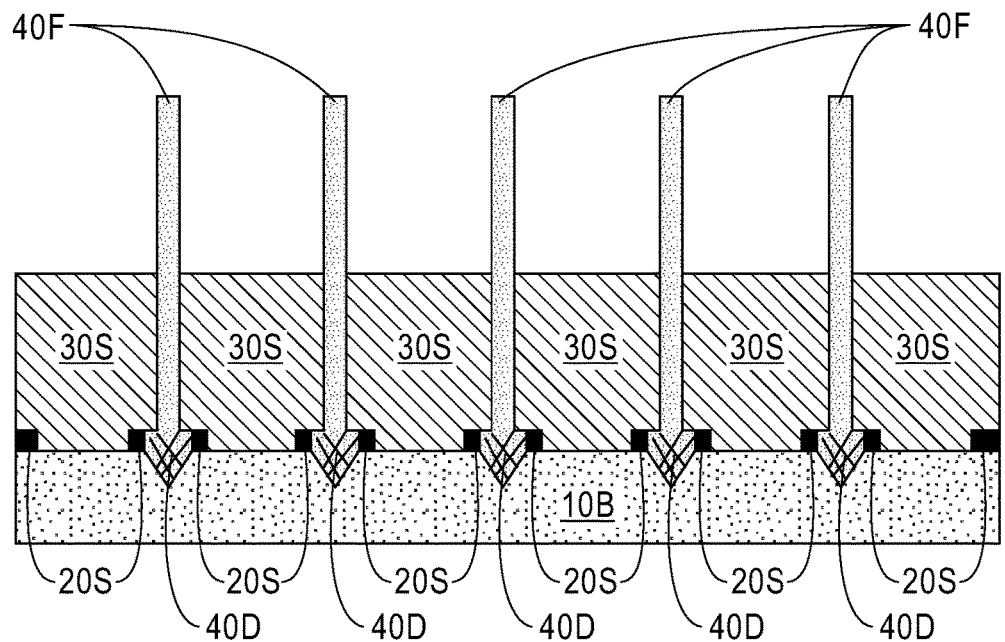
FIG. 8 is a cross sectional view of the first exemplary semiconductor structure of FIG. 7 after recessing each semiconductor oxide portion to expose an upper portion of each epitaxial semiconductor fin.

Referring now to FIG. 8, there is illustrated the first exemplary semiconductor structure of FIG. 7 after recessing each semiconductor oxide portion 30 to expose an upper portion of each epitaxial semiconductor fin 40F.

The recessing of each semiconductor oxide portion 30 may be performed utilizing an anisotropic etch that removes the dielectric oxide that provides each semiconductor oxide portion 30 selective to the semiconductor material that provides each epitaxial semiconductor fin 40F. In one example, and when each semiconductor oxide portion 30 is composed of silicon dioxide, the recessing of each semiconductor oxide portion 30 may be performed utilizing a dry etch such as, for example, RIE or a wet etch. After recessing, a remaining portion of each semiconductor oxide portion 30 constitutes a semiconductor oxide insulator structure 30S. As is shown, after recessing, the topmost surface of each semiconductor oxide insulator structure 30S is located below the topmost surface of each second semiconductor 40F such that sidewall surfaces of the upper portion of each epitaxial semiconductor fin 40F are exposed. Each semiconductor oxide insulator structure 30S has a width that is greater than a width of an underlying bottom spacer 20S.

At this point of the present application, a gate structure (not shown) can be formed straddling a portion of the physically exposed upper portion of each epitaxial semiconductor fin 40F (not shown). By "straddling" it is meant that the gate structure formed is in direct contact with a topmost surface and two vertical sidewalls of the physically exposed upper portion of each epitaxial semiconductor fin 40F. The gate structure can be formed utilizing a gate first or a gate last process known in the art. The gate structure may include a gate dielectric portion and a gate conductor portion. Subsequently, a source region and a drain region (collectively referred to source/drain regions) can be formed on opposite sides of the gate structure within the physically exposed upper portion of each epitaxial semiconductor fin 40F to provide a FinFET (not shown).

Figure 9:
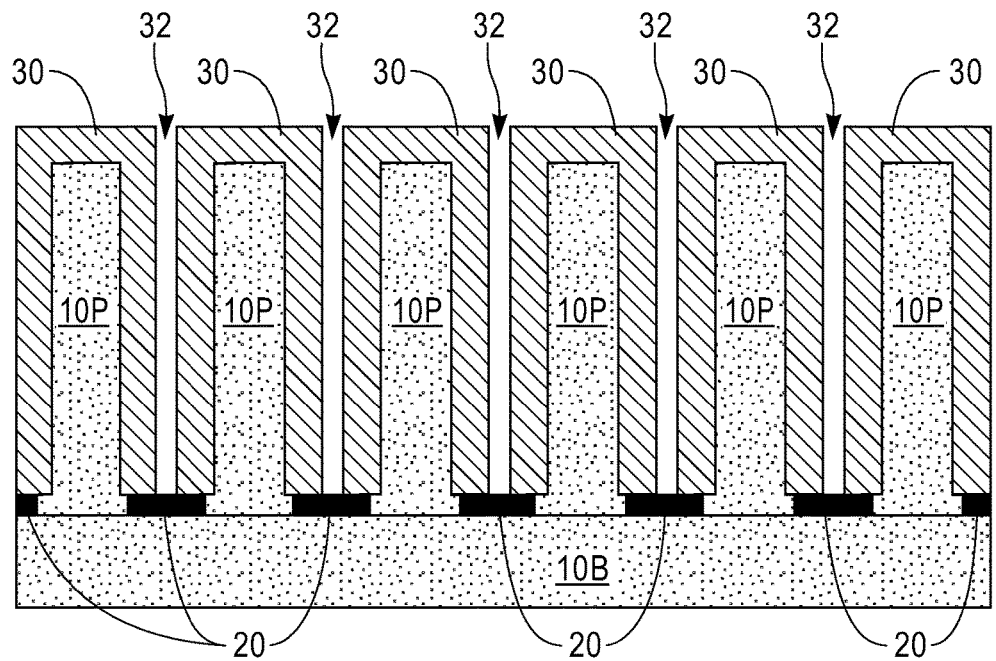
FIG. 9 is a cross sectional view of a second exemplary semiconductor structure according to a second embodiment of the present application that can be derived from the first exemplary semiconductor structure of FIG. 2 after partially oxidizing each semiconductor fin, thereby forming a semiconductor oxide portion surrounding each semiconductor fin portion.

Referring now to FIG. 9, there is illustrated a second exemplary semiconductor structure according to a second embodiment of the present application that can be derived from the first exemplary semiconductor structure of FIG. 2 after partially oxidizing each semiconductor fin 10F, thereby forming a semiconductor oxide portion 30 surrounding a remaining portion of each semiconductor fin 10F (herein referred to as a semiconductor fin portion 10P). The partial oxidation of each semiconductor fin 10F can be performed utilizing the oxidation process described above in FIG. 3. After the oxidation process, a narrowed trench 32 is provided between each pair of neighboring semiconductor oxide portions 30.

Figure 10:
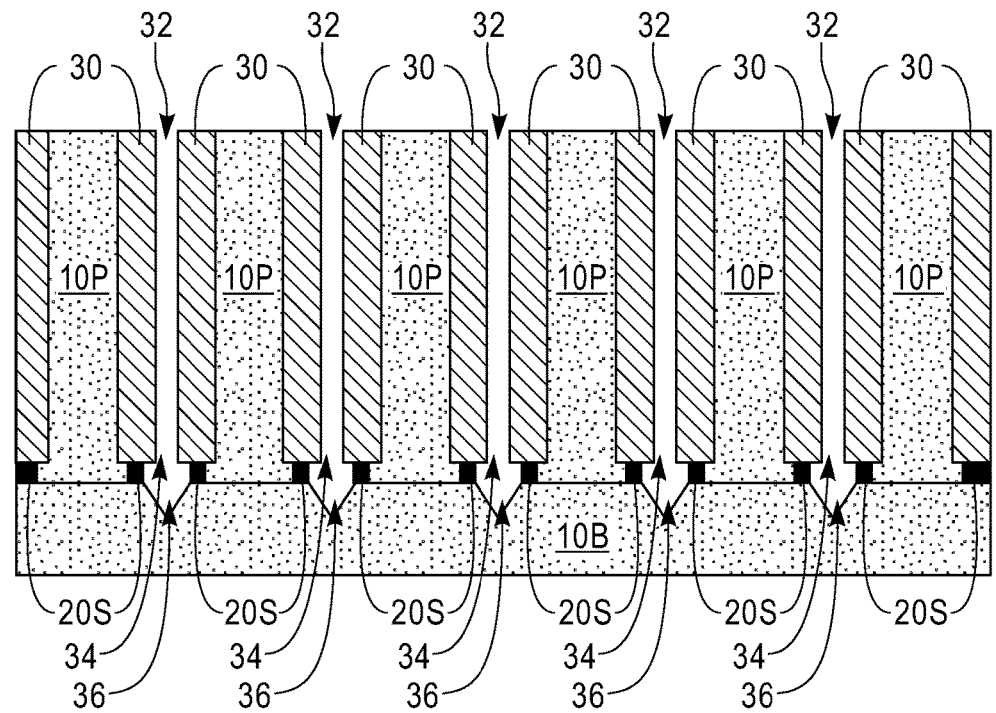
FIG. 10 is a cross sectional view of the second exemplary semiconductor structure of FIG. 9 after forming ART trenches.

Referring now to FIG. 10, there is illustrated the second exemplary semiconductor structure of FIG. 9 after forming an opening 34 underneath each narrowed trench 32 by performing the processing steps described above in FIG. 4. Each pair of the narrowed trench 32 and the opening 34 constitute an ART trench. As is shown, each opening 34 is laterally surrounded by a bottom spacer 20S. In some embodiments, an optional faceted opening 36 may be formed beneath each opening 34 by performing the processing steps described above in FIG. 5 and the optional faceted opening 36 becomes part of the ART trench.

Figure 11:
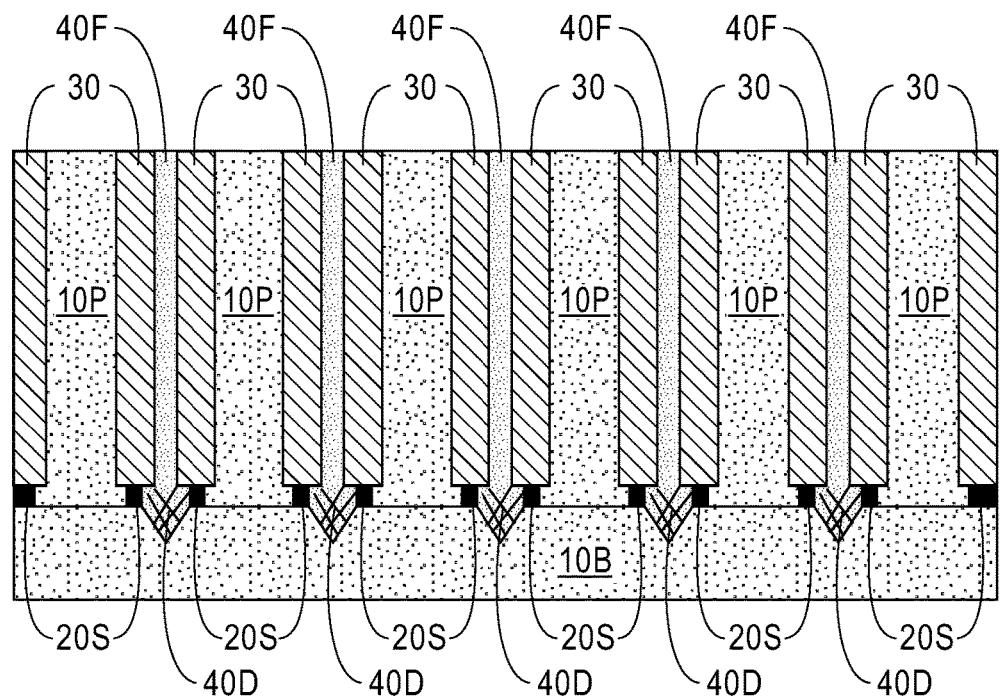
FIG. 11 is a cross sectional view of the second exemplary semiconductor structure of FIG. 10 after forming epitaxial semiconductor fins within the ART trenches.

Referring now to FIG. 11, there is illustrated the second exemplary semiconductor structure of FIG. 10 after forming epitaxial semiconductor fins 40F by performing the processing steps described above in FIGS. 6 and 7. As is shown, each epitaxial semiconductor fin 40F contains a defect-containing region 40D at the bottom portion.

Figure 12:
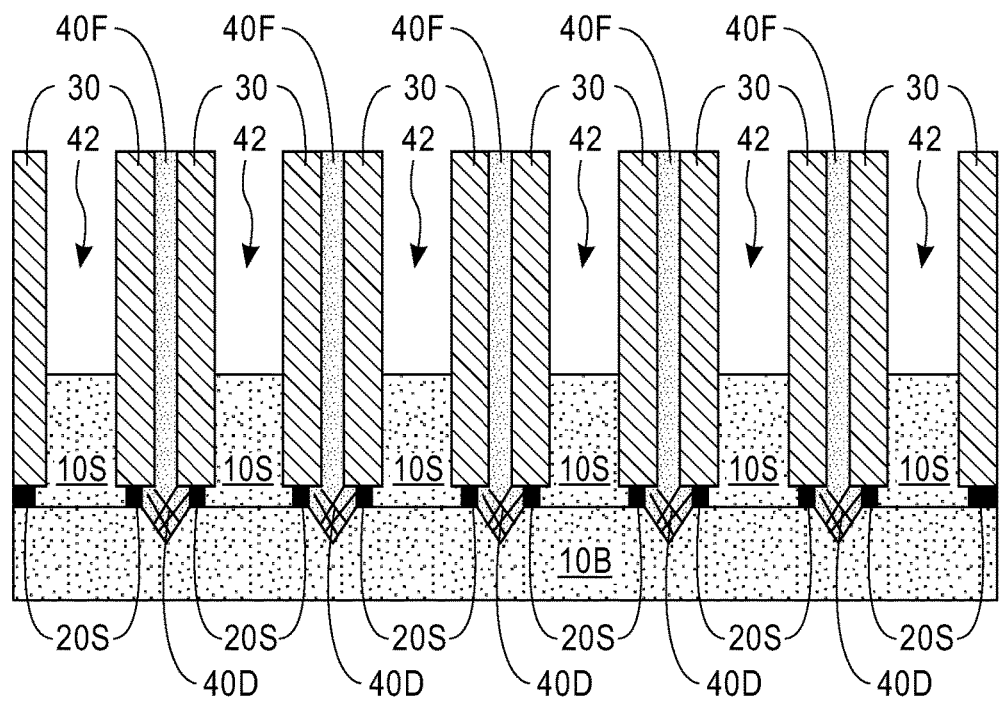
FIG. 12 is a cross sectional view of the second exemplary semiconductor structure of FIG. 11 after recessing each semiconductor fin portion, thereby providing a semiconductor fin base portion and providing a cavity above each semiconductor fin base portion.

Referring now to FIG. 12, there is illustrated the second exemplary semiconductor structure of FIG. 11 after recessing each semiconductor fin portion 10P, thereby providing a semiconductor fin base portion 10S laterally contacting sidewalls of lower portions of each pair of neighboring semiconductor oxide portions 30.

The recessing of each semiconductor fin portion 10P can be performed utilizing an etch process that removes the semiconductor material that provides the semiconductor fin portions 10P selective to the dielectric oxide that provides the semiconductor oxide portions 10P and the semiconductor material that provides the epitaxial semiconductor fins 40F. In one embodiment, a dry etch employing hydrochloric acid vapor can be employed to recess each semiconductor fin portion 10P. After recessing, each semiconductor fin base portion 10S thus formed has a topmost surface located below the topmost surface of each semiconductor oxide portion 30. A cavity 42 is thus formed above each semiconductor fin base portion 10S and laterally surrounded by each pair of neighboring semiconductor oxide portion 30.

Figure 13:
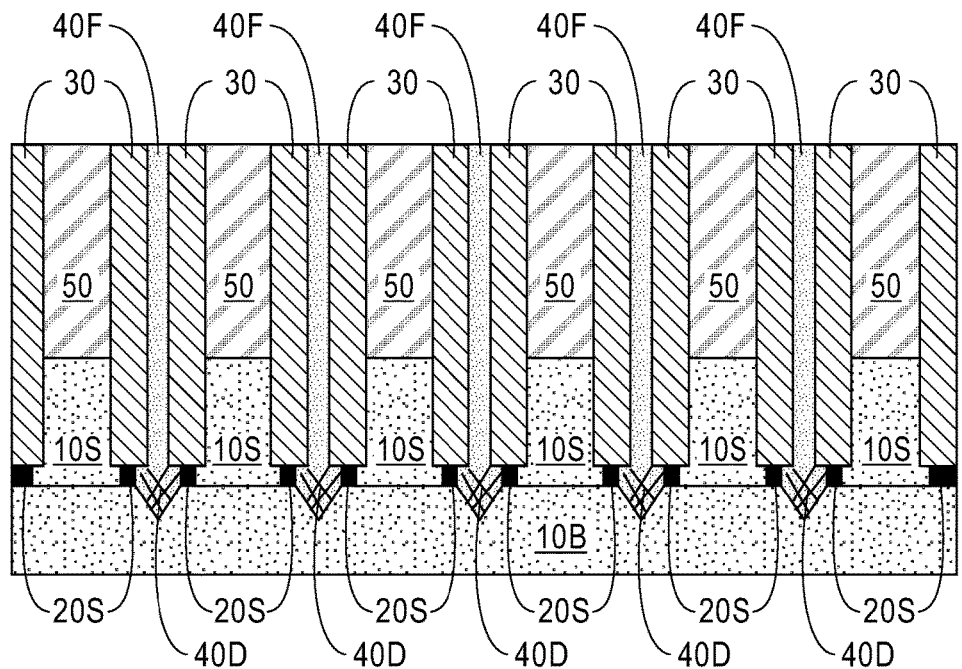
FIG. 13 is a cross sectional view of the second exemplary semiconductor structure of FIG. 12 after forming a dielectric fill portion within each cavity.

Referring now to FIG. 13, there is illustrated the second exemplary semiconductor structure of FIG. 12 after forming a dielectric fill portion 50 within each cavity 42 to completely fill each cavity 42. Each dielectric fill portion 50 thus has a topmost surface coplanar with the topmost surfaces of each semiconductor oxide portion 30 and each epitaxial semiconductor fin 40F.

Each dielectric fill portion 50 may include a dielectric oxide, dielectric nitride or dielectric oxynitride. In one embodiment, each dielectric fill portion 50 is composed of a flowable oxide such as, for example, silicon dioxide. Each dielectric fill portion 50 can be formed utilizing a deposition process such as, for example, CVD or PECVD and subsequently planarized, for example, by CMP using the topmost surfaces of the semiconductor oxide portions 30 and the epitaxial semiconductor fins 40F as an etch stop.

Figure 14:
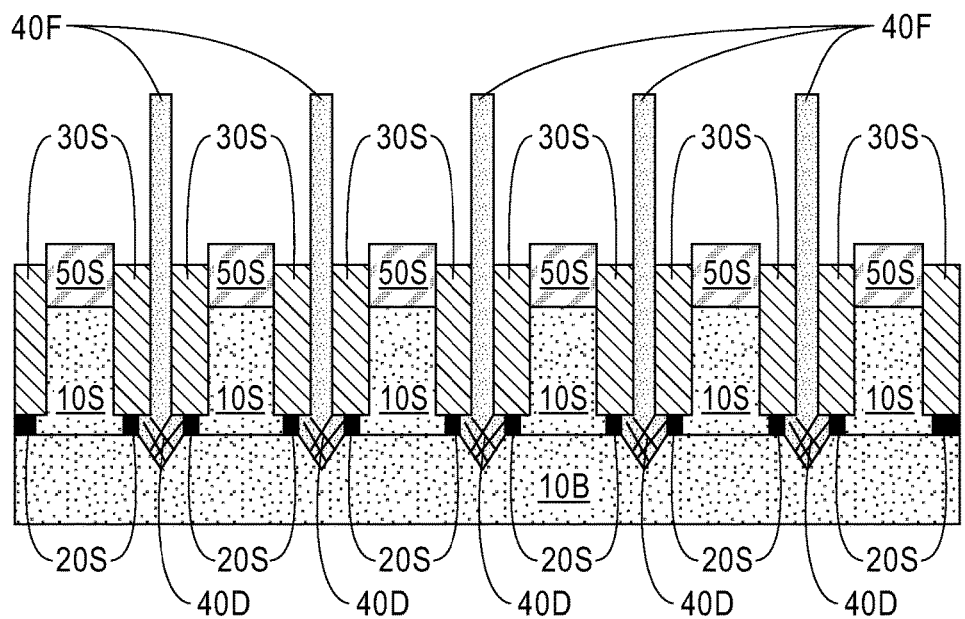
FIG. 14 is a cross sectional view of the second exemplary semiconductor structure of FIG. 13 after recessing each semiconductor oxide portion and each dielectric fill portion to expose an upper portion of each epitaxial semiconductor fin.

Referring now to FIG. 14, there is illustrated the second exemplary semiconductor structure of FIG. 13 after recessing each semiconductor oxide portion 30 and each dielectric fill portion 50 to expose an upper portion of each epitaxial semiconductor fin 40F.

The recessing of each semiconductor oxide portion 30 and each dielectric fill portion 50 may be performed by an etch-back process that removes the dielectric material that provides the semiconductor oxide portions 30 and the dielectric material that provides the dielectric fill portions 50 selective to the semiconductor material that provides the epitaxial semiconductor fins 40F. In one embodiment, the etch-back process can be a dry etch such as, for example, RIE. A remaining portion of each semiconductor oxide portion 30 atop one of the semiconductor fin base portions 10S constitutes a semiconductor oxide insulator structure 30S, and a remaining portion of each dielectric fill portion 50 constitutes a dielectric insulator structure 50S Because of the different etching rates between the semiconductor oxide portions 30 and the dielectric fill portions 50, the semiconductor oxide portions 30 are recessed to an extent different from the dielectric fill portions 50. In one embodiment and as show, the topmost surfaces of the semiconductor oxide insulator structure 30S are located below the topmost surfaces of the dielectric insulator structure 50S.

At this point of the present application, a gate structure (not shown) can be formed straddling a portion of the physically exposed upper portion of each epitaxial semiconductor fin 40F (not shown). The gate structure can be formed utilizing a gate first or a gate last process known in the art. The gate structure may include a gate dielectric portion and a gate conductor portion. Subsequently, a source region and a drain region (collectively referred to source/drain regions) can be formed on opposite sides of the gate structure within the physically exposed upper portion of each epitaxial semiconductor fin 40F to provide a FinFET (not shown).

Figure 15:
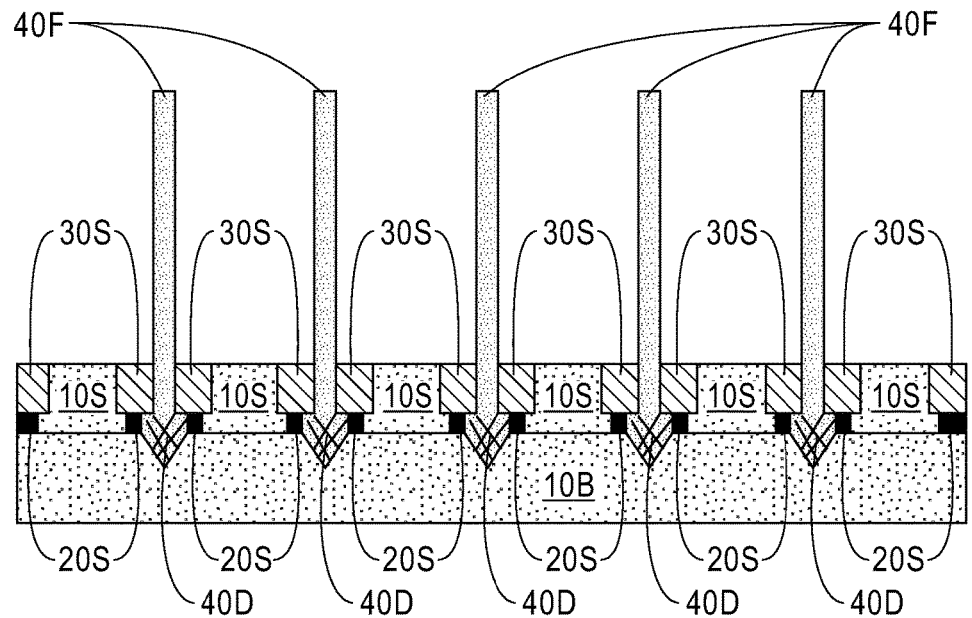
FIG. 15 is a cross sectional view of a third exemplary semiconductor structure according to a third embodiment of the present application that can be derived from the second exemplary semiconductor structure of FIG. 11 after recessing each semiconductor fin portion and each semiconductor oxide portion to expose a portion of each epitaxial semiconductor fin.

Referring now to FIG. 15, there is illustrated a third exemplary semiconductor structure according to a third embodiment of the present application that can be derived from the second exemplary semiconductor structure of FIG. 11 after recessing each semiconductor fin portion 10P) and each semiconductor oxide portion 30 to expose a portion of each epitaxial semiconductor fin 40F.

The semiconductor fin portions 10P and the semiconductor oxide portions 30 can be recessed by a single etching process in which the semiconductor fin portions 10P and the semiconductor oxide portions 30 are etched simultaneously or by multiple etching processes in which the semiconductor fin portions 10P and the semiconductor oxide portions 30 are etched separately. The etching process can be a dry etch such as RIE or a wet etch. In the third embodiment, the semiconductor oxide portions 30 are recessed to a greater extent than that in the first embodiment or the second embodiment. After recessing, a remaining portion of each semiconductor fin portion 10P constitutes a semiconductor fin base portion 10S, and a remaining portion of each semiconductor oxide portion 30 constitutes a semiconductor oxide insulator structure 30S. The topmost surface of each semiconductor fin base portion 10S is coplanar with the topmost surface of semiconductor oxide insulator structure 30S.

Figure 16:
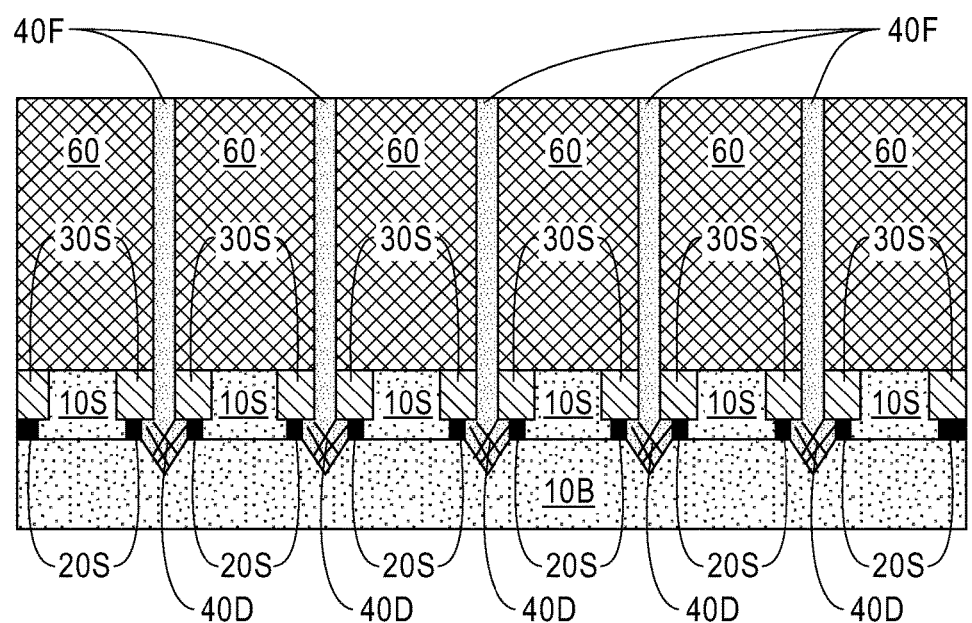
FIG. 16 is a cross sectional view of the third exemplary semiconductor structure of FIG. 15 after forming a dielectric insulator layer laterally surrounding the physically exposed portion of each epitaxial semiconductor fin.

Referring now to FIG. 16, there is illustrated the third exemplary semiconductor structure of FIG. 15 after forming a dielectric insulator layer 60 over the semiconductor fin base portions 10S and the semiconductor oxide insulator structures 30S, laterally surrounding the physically exposed portion of each epitaxial semiconductor fin 40F. The dielectric insulator layer 60 is deposited to a depth such that a topmost surface of the dielectric insulator layer 60 is coplanar with the topmost surfaces of the epitaxial semiconductor fins 40F.

The dielectric insulator layer 60 may include any dielectric material such as, for example, a dielectric oxide, a dielectric nitride or a dielectric oxynitride. In one embodiment, the dielectric insulator layer 60 is composed of a flowable oxide such as, for example, silicon dioxide. The dielectric insulator layer 60 can be formed utilizing a deposition process such as, for example, CVD or PECVD and subsequently planarized, for example, by CMP using the topmost surfaces of the epitaxial semiconductor fins 40F as an etch stop.

Figure 17:
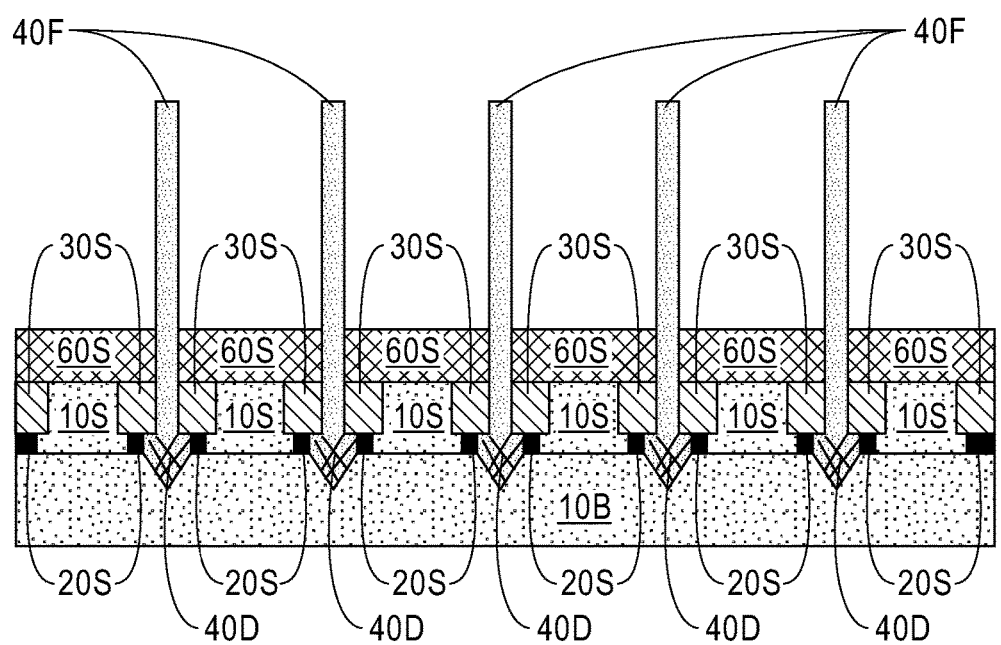
FIG. 17 is a cross sectional view of the third exemplary semiconductor structure of FIG. 16 after recessing the dielectric insulator layer to expose an upper portion of each epitaxial semiconductor fin.

Referring now to FIG. 17, there is illustrated the third exemplary semiconductor structure of FIG. 16 after recessing the dielectric insulator layer 60 to expose an upper portion of each epitaxial semiconductor fin 40F. A remaining portion of the dielectric insulator layer 60 constitutes a dielectric insulator structure 60S. The dielectric insulator structure 60S covers the semiconductor fin base portions 10S as well as the semiconductor oxide insulator structures 30S.

The recessing of the dielectric insulator layer 60 may be performed by an etch-back process that removes the dielectric material that provides the dielectric insulator layer 60 selective to the semiconductor material that provides the epitaxial semiconductor fins 40F. In one embodiment, the etch-back process can be a dry etch such as, for example, RIE. The topmost surface of the dielectric insulator structure 60S that is formed is vertically offset and located beneath the topmost surfaces of the epitaxial semiconductor fins 40F.

At this point of the present application, a gate structure (not shown) can be formed straddling a portion of the physically exposed upper portion of each epitaxial semiconductor fin 40F (not shown). The gate structure can be formed utilizing a gate first or a gate last process known in the art. The gate structure may include a gate dielectric portion and a gate conductor portion. Subsequently, a source region and a drain region (collectively referred to source/drain regions) can be formed on opposite sides of the gate structure within the physically exposed upper portion of each epitaxial semiconductor fin 40F to provide a FinFET (not shown).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of epitaxial semiconductor fins located permanently on, and in direct physical contact with, a semiconductor material portion of a substrate, wherein each epitaxial semiconductor fin is inverted T-shaped having a horizontal bottom portion and a vertically extending upper portion, wherein the horizontal bottom portion is wider than the vertically extending upper portion;
a bottom spacer laterally surrounding, and directly contacting, a sidewall surface of the horizontal bottom portion of each epitaxial semiconductor fin, wherein the bottommost spacer has a bottommost surface directly contacting a topmost surface of the semiconductor material portion of the substrate; and
a semiconductor oxide insulator structure located between each pair of neighboring epitaxial semiconductor fins and neighboring bottom spacers and having a topmost surface located below a topmost surface of each epitaxial semiconductor fin, wherein the semiconductor oxide insulator structure has a horizontal bottom surface that comprises a first portion directly contacting an entirety of a topmost surface of the bottom spacer and a second portion, adjacent to the first portion, directly contacting a portion of the topmost surface of the horizontal bottom portion of each epitaxial semiconductor fin, and wherein the bottom spacer has a width that is less than a width of the semiconductor oxide insulator structure.

2. The semiconductor structure of claim 1, wherein the bottom spacer comprises a dielectric material different from that of the semiconductor oxide insulator structure.

3. The semiconductor structure of claim 1, wherein the semiconductor oxide insulator structure laterally contacts sidewalls of the vertical portions of each pair of the neighboring epitaxial semiconductor fins and the neighboring bottom spacers.

4. The semiconductor structure of claim 1, wherein each epitaxial semiconductor fin further comprises a faceted portion embedded in the semiconductor material portion of the substrate and located beneath the horizontal bottom portion of each epitaxial semiconductor fin.

5. The semiconductor structure of claim 4, wherein the faceted portion is V-shaped.

6. The semiconductor structure of claim 1, wherein the semiconductor oxide insulator structure occupies an entire space between each pair of the neighboring epitaxial semiconductor fins and the neighboring bottom spacers.

7. The semiconductor structure claim 1, wherein the semiconductor oxide insulator structure partially fills a space between each pair of the neighboring epitaxial semiconductor fins and the neighboring bottom spacers and contacting sidewalls of each pair of the neighboring epitaxial semiconductor fins and the neighboring bottom spacers.

8. The semiconductor structure of claim 7, further comprising a semiconductor fin base portion located between each pair of the neighboring epitaxial semiconductor fins and the neighboring bottom spacers and laterally surrounded by the semiconductor oxide insulator structure, wherein the semiconductor fin base portion comprises a different semiconductor material than each epitaxial semiconductor fin.

9. The semiconductor structure of claim 8, further comprising a dielectric insulator structure atop the semiconductor fin base portion, which a topmost surface of each dielectric insulator structure is located above or below the topmost surface of each semiconductor oxide insulator structure.

10. The semiconductor structure of claim 8, further comprising a dielectric insulator structure atop each semiconductor fin base portion and each semiconductor oxide insulator structure.

* * * * *